(12) United States Patent
Chirico et al.

(10) Patent No.: US 12,390,832 B2
(45) Date of Patent: Aug. 19, 2025

(54) UV CURING SYSTEM WITH UV LAMP TROLLEY SYSTEM

(71) Applicant: SPECIALTY COATING SYSTEMS, INC., Indianapolis, IN (US)

(72) Inventors: Robert John Chirico, Indianapolis, IN (US); Robert Roy Henderson, Jr., Beech Grove, IN (US); Imran Ahmad, Carmel, IN (US); Jason Michael Teal, Fishers, IN (US); Rodney Miller, Zionsville, IN (US)

(73) Assignee: SPECIALTY COATING SYSTEMS, INC., Indianapolis, IN (US)

( * ) Notice: Subject to any disclaimer, the term of this patent is extended or adjusted under 35 U.S.C. 154(b) by 456 days.

(21) Appl. No.: 18/166,903

(22) Filed: Feb. 9, 2023

(65) Prior Publication Data
US 2023/0249218 A1 Aug. 10, 2023

Related U.S. Application Data

(60) Provisional application No. 63/267,763, filed on Feb. 9, 2022.

(51) Int. Cl.
*B05D 3/06* (2006.01)
*B01J 19/12* (2006.01)

(52) U.S. Cl.
CPC ............ *B05D 3/067* (2013.01); *B01J 19/123* (2013.01); *B01J 2219/1203* (2013.01)

(58) Field of Classification Search
CPC .. B05D 3/067; B01J 19/123; B01J 2219/1203
See application file for complete search history.

(56) References Cited

U.S. PATENT DOCUMENTS 5,288,526 A    2/1994  Hogan et al.
2013/0320235 A1*  12/2013  Lien ................... H01L 21/3105
                                                        250/454.11

FOREIGN PATENT DOCUMENTS

DE   102016112122 A1 *  6/2017  .......... B41F 23/0409
GB        2072821 A     10/1981

OTHER PUBLICATIONS

Translation of DE 10 2016 112 112 (Year: 2017).*

* cited by examiner

*Primary Examiner* — Nicole M Ippolito

(57) ABSTRACT

A UV oven for curing an applied coating on a part, includes a housing having a top wall, a bottom wall, and side walls that enclose an interior volume of the housing. The UV oven further includes a first shutter and a second shutter located on the side walls and configured to be selectively opened to selectively allow the part to enter or exit the interior volume of the housing. The UV oven further includes a conveyor secured to the housing and having a surface on which the part may be supported and at least one UV lamp supported within the housing by a carriage that is movable with respect to the housing. A method of curing an applied coating on a part is further disclosed.

20 Claims, 6 Drawing Sheets

UV CURING SYSTEM WITH UV LAMP TROLLEY SYSTEM

CROSS-REFERENCE TO RELATED APPLICATION

This application claims the benefit of priority to U.S. Provisional Patent Application Ser. No. 63/267,763 filed on Feb. 9, 2022, the entire disclosure of which is hereby incorporated herein by reference in its entirety for all purposes.

BACKGROUND OF THE DISCLOSURE

1. Field of the Disclosure

The present disclosure relates to systems and methods for curing one or more materials on a substrate using ultraviolet (UV) radiation. For example, UV light may be used to cure materials on a substrate in the form of a printed circuit board. In some examples, the material cured by the UV light may include an ink, a coating, another material, or some combination thereof. The material to be cured may be configured to protect the substrate from damage caused by the environment in which the circuit board operates, such as moisture, dust, chemicals and temperature.

2. Discussion of Related Art

According to prior art methods for UV curing, a substrate is moved beneath a UV source that has a fixed location, and a UV dose is applied to the moving substrate. This method requires a large housing to enclose the UV source and substrate. This method also exposes the substrate to excessive heat. Existing UV ovens accomplish a higher UV dosage via a slower movement of a part through the irradiated area. A slow movement of the part through the irradiated area of the UV oven can easily overheat the substrate to which the UV curable material is applied. Prior art systems do not allow for controlling a dosage of UV radiation applied to a substrate independent of the speed of the conveyor that moves the substrate.

Prior art systems for UV curing also require the UV oven to be large relative to the substrate. For example, for a substrate having a length of 21 inches, a prior art UV oven including a fixed UV lamp would have an oven length of 63 inches to allow for closure of inlet shutter and outlet shutter and to safely protect operators of the oven during UV curing of the substrate.

SUMMARY OF THE DISCLOSURE

One aspect of the present disclosure is directed to a method of UV curing a coating on a part, the method comprising: conveying a part that has an applied coating thereon into a housing; exposing the applied coating to UV light from at least one UV lamp supported within the housing by moving the at least one UV lamp relative to the housing; and conveying the part out of the housing.

Another aspect of the present disclosure is directed to a UV oven as shown and described herein.

Another aspect of the present disclosure is directed to a method of operating a UV oven as shown and described herein.

Another aspect of the present disclosure is directed to a system including a UV oven as shown and described herein.

Another aspect of the present disclosure is directed to a UV oven for curing an applied coating on a part, the UV oven comprising: a housing including a top wall, a bottom wall, and side walls that enclose an interior volume of the housing; a first shutter located on the side walls and configured to be selectively opened to selectively allow the part to enter or exit the interior volume of the housing; a conveyor secured to the housing and having a surface on which the part may be supported; and at least one UV lamp supported within the housing by a carriage that is movable with respect to the housing.

In some embodiments, the at least one UV lamp is a plurality of UV lamps.

In some embodiments, the UV oven further comprises a pair of guide rails secured to the housing that support the carriage.

In some embodiments the carriage is movable from a first location at which the carriage is located towards one of the side walls to one or more other locations along the guide rails.

In some embodiments, the UV oven further comprises at least one actuator to move the carriage along the guide rails.

In some embodiments, the UV oven further comprises a controller and at least one sensor for detecting a position of the part or a position of the carriage, the controller being configured to cause the at least one actuator to move the carriage in response to a signal received from the at least one sensor.

In some embodiments, the at least one actuator is configured to move the carriage at a preprogrammed rate.

In some embodiments, the at least one actuator is configured to move the carriage at a variable rate.

In some embodiments, the variable rate is based on a thickness of the part.

In some embodiments, the variable rate includes a first rate when the carriage is moved over a first portion of the part and a second rate when the carriage is moved over a second portion of the part, the first rate being faster than the second rate.

In some embodiments, the UV oven further comprises a second shutter located on the side walls and configured to be selectively opened to selectively allow the part to enter or exit the interior volume of the housing.

In some embodiments, the UV oven further comprises a trolley secured to the housing for moving the part through the housing.

In some embodiments, the at least one UV lamp includes one of a microwave activated UV curing lamp, an arc lamp, or an LED lamp.

In some embodiments, the UV oven further comprises a controller, wherein the at least one UV lamp includes a plurality of UV lamps, and the controller is configured to cause a first set of UV lamps selected from the plurality of UV lamps to illuminate.

In some embodiments, the controller is further configured to turn the first set of UV lamps off and to subsequently cause a second set of UV lamps selected from the plurality of UV lamps to illuminate.

Another aspect of the present disclosure is directed to a method of UV curing an applied coating on a part, the method comprising: conveying a part that has an applied coating thereon into a housing; exposing the applied coating to UV light from at least one UV lamp supported within the housing by moving the at least one UV lamp relative to the housing; and conveying the part out of the housing.

In some embodiments, the method further comprises closing a first shutter of the housing and closing a second shutter of the housing after conveying the part into the housing.

In some embodiments, moving the at least one UV lamp relative to the housing includes moving the at least one UV lamp at a preprogrammed rate.

In some embodiments, moving the at least one UV lamp at the preprogrammed rate includes moving the at least one UV lamp at a variable rate.

In some embodiments, the variable rate is based on a thickness of the part.

In some embodiments, moving the at least one UV lamp at the variable rate includes moving the at least one UV lamp at a first rate over a first portion of the part and moving the at least one UV lamp at a second rate of a second portion of the part, the first rate being faster than the second rate.

In some embodiments, the applied coating is exposed to the UV light from the at least one UV lamp while the part is stationary with respect to the housing.

In some embodiments, moving the at least one UV lamp over the part includes moving the at least one UV lamp in response to a signal received by a controller from one or more sensors.

In some embodiments, the method further comprises turning the at least one UV lamp off; and moving the at least one UV lamp to a start position.

In some embodiments, the method further comprises turning the at least one UV lamp to a standby mode or turning the UV lamp off after exposing the applied coating to the UV light.

In some embodiments, the method further comprises opening the second shutter; and conveying the part out of the second shutter.

In some embodiments, the method further comprises opening the first shutter; and loading a subsequent part into the housing through the first shutter.

In some embodiments, conveying the part through the second shutter and loading the subsequent part into the housing are performed simultaneously.

In some embodiments, the part is a printed circuit board assembly.

In some embodiments, exposing the applied coating to UV light includes applying an amount of UV light that is selected by a user.

In some embodiments, the method further comprises moving the part through the housing on a trolley secured to the housing.

In some embodiments, the at least one UV lamp includes one of a microwave activated UV curing lamp, an arc lamp, or an LED lamp.

In some embodiments, the at least one UV lamp includes a plurality of UV lamps, and exposing the applied coating to UV light includes illuminating a first set of UV lamps selected from the plurality of UV lamps.

In some embodiments, the method further comprises turning the first set of UV lamps off and subsequently illuminating a second set of UV lamps selected from the plurality of UV lamps.

In some embodiments, the first set of UV lamps and the second set of UV lamps do not include any of the same UV lamps.

The present disclosure will be more fully understood after a review of the following figures, detailed description and claims.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. Reference is made to the following drawing figures, which are incorporated herein by reference and in which.

DETAILED DESCRIPTION OF THE PREFERRED EMBODIMENTS

Figure 1A:
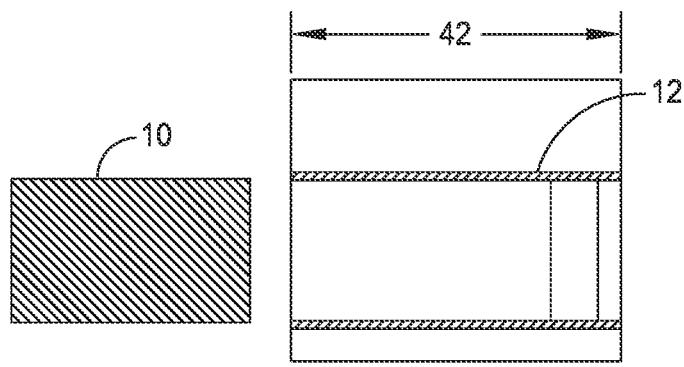
FIGS. 1A-1D are schematic top views of an embodiment of a UV curing system with UV lamp trolley system.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The apparatus of embodiments disclosed herein is capable of other embodiments and of being practiced or being carried out in various ways. Also, the phraseology and terminology used herein is for the purpose of description and should not be regarded as limiting. The use of "including," "comprising," "having," "containing" "involving," and variations thereof herein, is meant to encompass the items listed thereafter and equivalents thereof as well as additional items.

For purposes of illustration, embodiments of the present disclosure will now be described with reference to a UV curing system including a UV oven, which is configured to apply UV radiation to parts within the UV oven, a controller to control operation of UV lamps of the UV oven, and a conveyor configured to provide parts to the UV oven.

Generally, in an embodiment of a method of the present disclosure, a part that has an applied coating thereon is conveyed into the UV oven via the conveyor, the applied coating is cured by exposing the coating to UV light from the UV lamps of the UV oven, and then the part is conveyed out of the UV oven via the conveyor. The part may be conveyed from the UV oven to downstream equipment for further processing of the part, or the part may be collected, such as for storage or for packaging.

In a certain embodiment, a conveyor conveys a part, such as a Printed Circuit Board Assembly (PCBA), into a UV oven. An entry shutter on a housing of the UV oven opens, the part traverses into the housing until it reaches a board stop location. The entry shutter and an exit shutter on the housing then close. UV lamps within the housing illuminate, and the lamps then move over the part at a rate programmed by an operator, and controlled by a controller, that sends command signals to at least one actuator. After UV curing of the part is complete, the lamps then stop moving, and the lamps are turned off or turned to a standby mode. The entry and exit shutters on the housing open, and the part is conveyed out of the exit shutter on the housing simultaneously with loading a subsequent part into the housing of the oven through the entry shutter. The process then repeats as desired by an operator of the system. The UV radiation applied to each part may be selected based on the desired processing of the part.

In some embodiments, the UV lamps are mounted on a moving trolley system secured to the housing. The trolley system enables the user to program the rate of lamp movement to accommodate curing requirements in variable rate, versus other equipment that use stationary lamps mounted over a conveyor. For this reason, the dosage of UV light can be controlled by the speed of the lamp and the housing size can be reduced relative prior art UV ovens. The UV oven need only accommodate the maximum board length and lamp size. This greatly reduces the size of the UV oven versus a curing tunnel utilizing fixed lamp.

The ability to move the UV lamps via the trolley system, allows, if required by the coating material, to have multiple passes with the UV lamps for a higher UV dosage without the part leaving the machine.

In some embodiments, the UV oven, through a powered conveyor width assembly only energizes the lamps necessary to cure the required area. In some embodiments, a controller is configured to control selective illumination of some or all of the lamps. By energizing only the lamps necessary to cure the required area on a part, the UV oven has a longer service life for underutilized irradiator assemblies. Because not all of the lamps are energized during usage of the UV oven, the set of lamps will collectively last longer. For example, a first subset of lamps may be used for a first curing cycle of the UV oven, and a second subset of the lamps may be used for a second curing cycle of the UV oven, and other subsets of the lamps or various combinations of the subsets of the lamps may be used for subsequent curing cycles of the UV oven. The system also only energizes the UV lamp(s) when required and not when shuttling materials in and out of the machine. Energizing the lamps only when required can save significant electrical energy as the lamps are only energized as required. In some embodiments, the UV oven fully energizes all of the lamps of the UV oven to cure the required area.

Systems and methods of the present disclosure may be used to cure coatings having variable thicknesses. For example, the speed of the UV lamps over the part may be varied so thicker parts of the coating are exposed to the UV radiation for more time. In this way, systems and methods of the present disclosure account for three-dimensional properties of the circuit board and the applied coating, including coating variation and topography of the circuit board.

In some embodiments, the lamps are microwave activated UV curing lamps. In some embodiments, UV oven uses other UV curing technologies (e.g., arc lamps, LED lamps), which can use a similar lamp trolley concept to minimize machine floor space and energy usage.

Figure 1B:
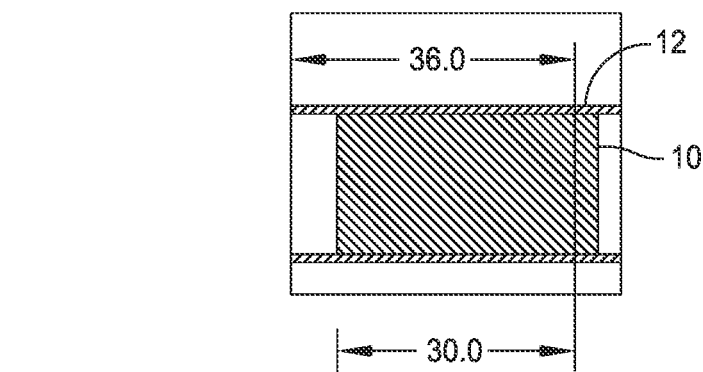
Figure 1C:
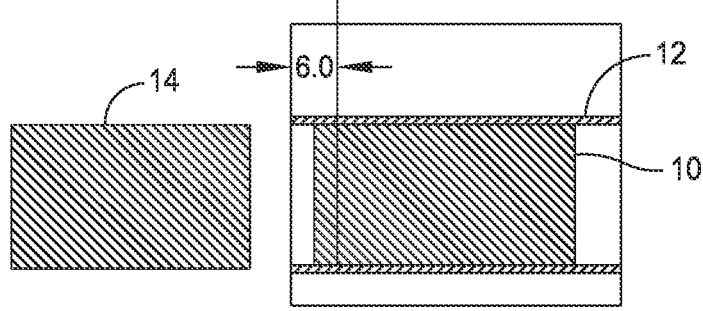
Figure 1D:
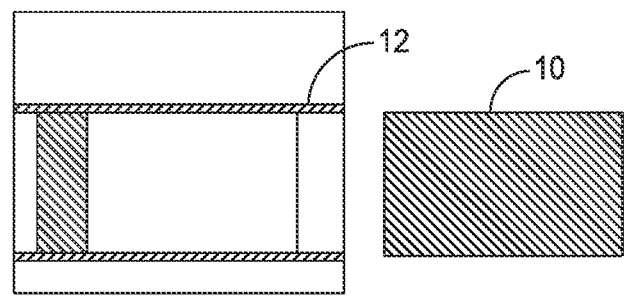

FIGS. 1A-1D show a schematic top view of a system performing a method of the present disclosure. In FIG. 1A, a part 10 is positioned adjacent to a UV oven 12. In FIG. 1B, the part 10 enters the oven 12. In FIG. 2C, a subsequent part 14 is positioned adjacent to the oven, and the part 10 within the oven 12 is exposed to radiation by lamps traveling over the part. The speed of the lamps over the part is controlled to achieve the desired radiation of various regions of the part. In FIG. 1D, the part 10 exits the oven 12, and the subsequent part (not shown in FIG. 1D) enters the oven for processing.

Figure 2:
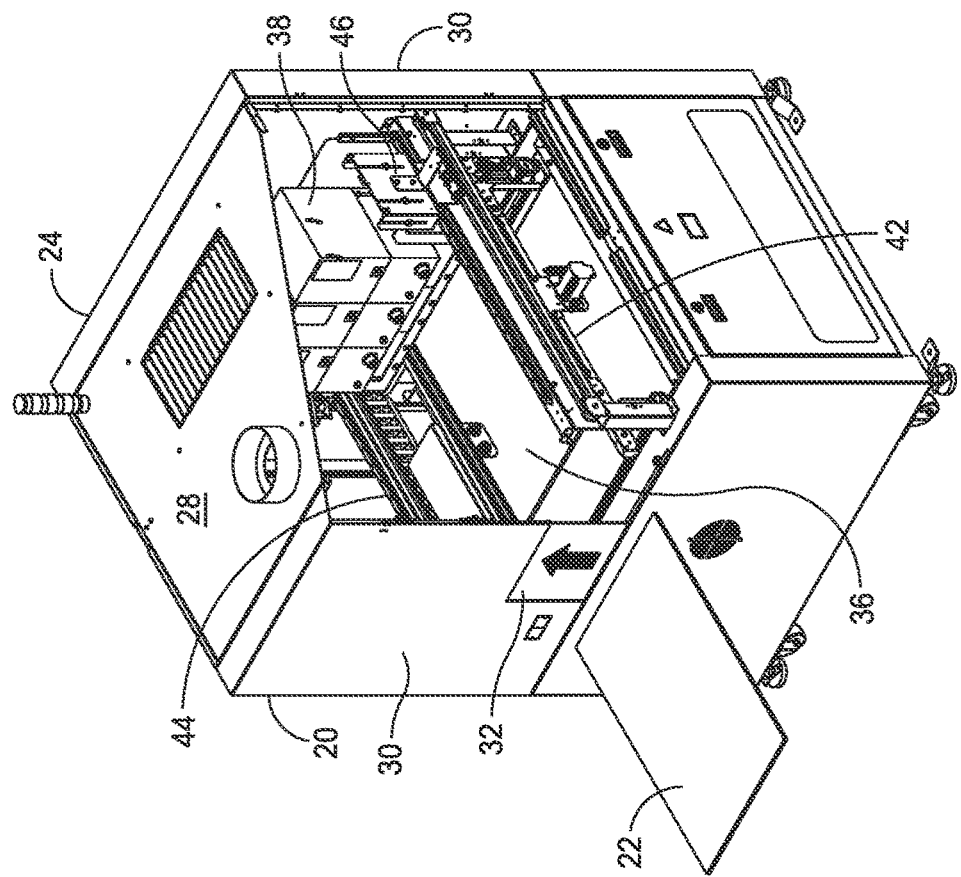
FIG. 2 is a first step in operating a UV curing system of the present disclosure.
Figure 4:
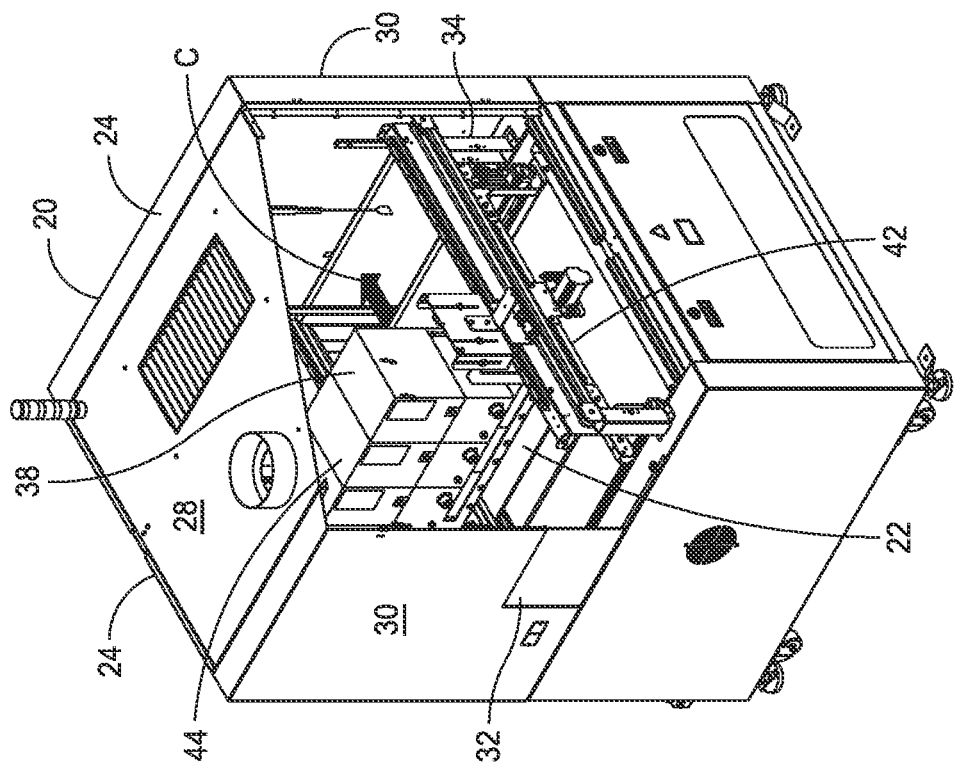
FIG. 4 is another step of operating the UV curing system of FIG. 2.

FIGS. 2-6 show an embodiment of a system of the present disclosure performing steps of an embodiment of a method of using a UV oven 20 to cure an applied coating on a part 22. In FIG. 2, the part 22 is shown outside of the oven 20.

Figure 3:
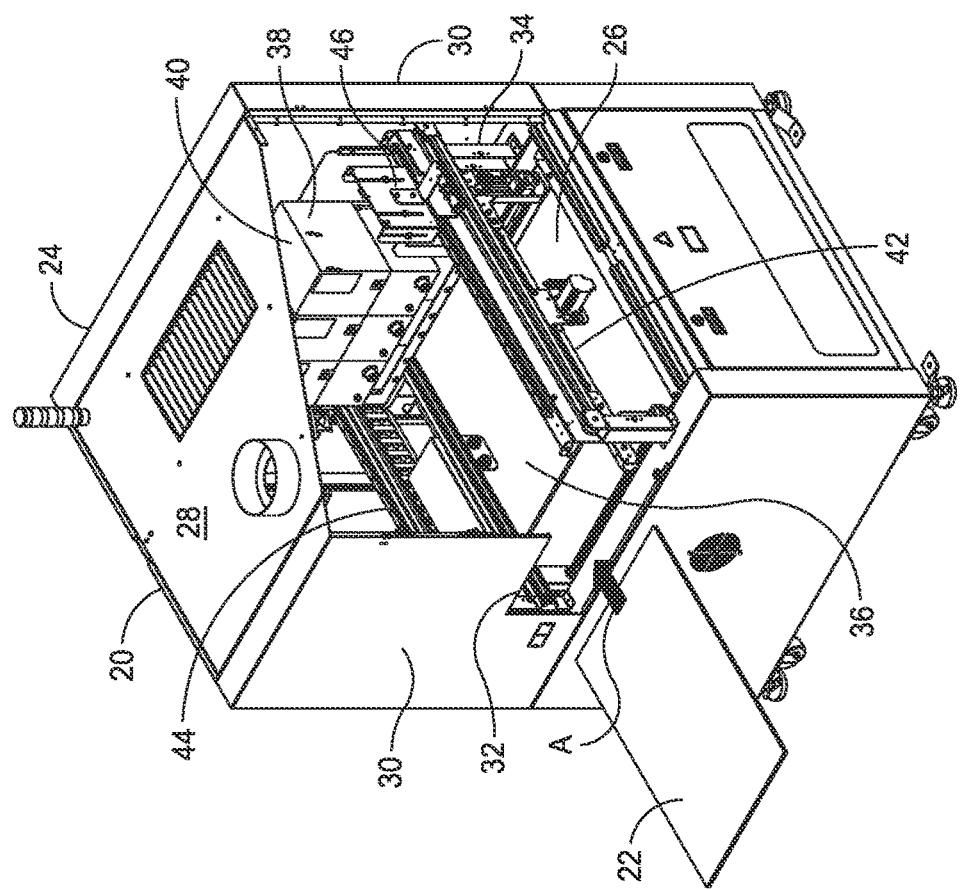
FIG. 3 is another step of operating the UV curing system of FIG. 2.

Turning first to the structure of the UV oven 20 shown in FIGS. 2 and 3, the UV oven 20 includes a housing 24 that encloses an interior volume. The housing 24 includes a bottom wall 26, a top wall 28, and side walls 30. Two shutters 32, 34 are located along the side walls 30. When the shutters 32, 34 are closed, the bottom wall 26, the top wall 28, the side walls 30, and the shutters 32, 34 prevent the part 22 from entering or exiting the housing 24. The shutters 32, 34 may be selectively opened to allow the part 22 to move into or out of the interior volume of the housing 24.

In some embodiments in which the UV oven 20 is used to cure a part having a length of 21 inches, the length of the interior volume of the UV oven 20, measured in from the shutter 32 to the shutter 34 is 42 inches. With a length of 42 inches, the internal volume is sufficiently large for the UV oven 20 to be used for curing the part after entering the UV oven 20 and staging of the part before exiting the UV oven 20.

Within the housing 24, the UV oven 20 includes a conveyor 36 having a surface on which the part is supported during UV treatment of the part 22 when the part 22 is in the interior volume of the housing 24.

The UV oven 20 also includes at least one UV lamp 38 positioned within the housing 24 and configured to be aimed at the part 22 when the part 22 is on the conveyor 36 within the housing 24. In the embodiment of FIGS. 2-6, a movable carriage 40 supports a plurality of UV lamps 38. Guide rails 42, 44 support the carriage 40 within the housing 24 so the carriage 40 is movable from a first location at which the carriage is located towards one of the side walls 30 of the housing 24 (as shown in FIG. 2) to other locations along the length of the guide rails 42, 44 (such as the location of the carriage 40 shown in FIG. 5). When the carriage 40 is moved along the guide rails 42, 44, the UV radiation is directed to the portions of the part 22 located beneath the lamps 38 carried by the carriage 40.

An actuator 46 is connected to the carriage 40 to move the carriage 40 along the guide rails 42, 44.

Figure 7:
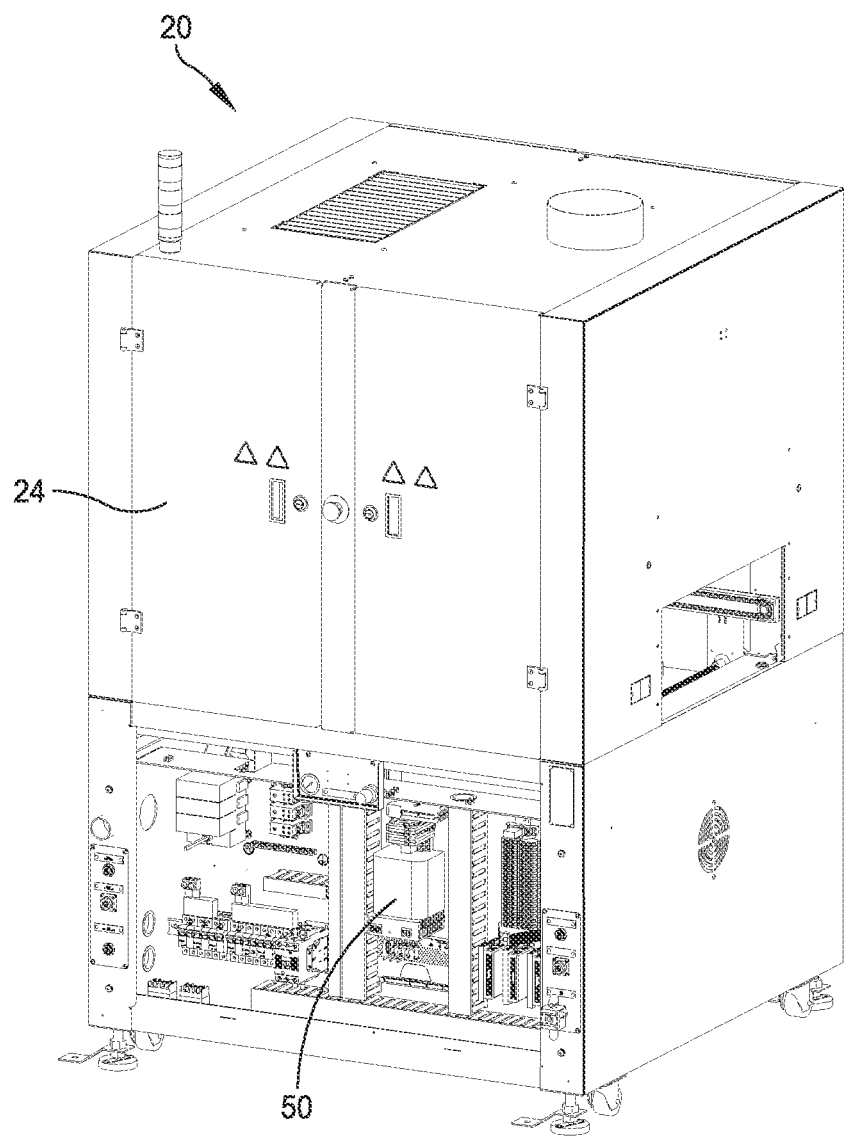
FIG. 7 is rear perspective view of the UV oven shown in FIG. 2.

The controller 50 (shown in FIG. 7) is connected to the actuator 46 to cause the actuator 46 to move the carriage 40 in a desired path along the guide rails 42, 44. The controller may be connected to one or more sensors, and the controller may cause the actuator 46 to move the carriage 40 in response to a signal received by the controller from one or more of the sensors. In some embodiments, the sensors include position sensors for detecting a position of the carriage and/or the part.

The light applied by the UV lamp 38 on the carriage 40 to the part may be altered by changing the carriage speed. However, for a given part, the dose of UV light applied to a part would generally need to be equal to a desired dose for that part. The movable carriage 40 allows a user to vary the curing dose of UV exposure independent of the speed of the conveyor that moves the parts to/from the UV oven 20, thereby enabling a faster cure cycle time. Thus, as a result of the shortened length of the UV oven 20 coupled with the variable control of the speed of the movable carriage 40, the system is able to cure a given part more fully regardless of the speed of the conveyor that moves parts to/from the UV oven 20.

The part 22 shown in FIG. 2 includes a substrate and a coating applied to the substrate. In some embodiments, the substrate may be a PCBA. The coating includes at least one UV curable material.

Figure 8:
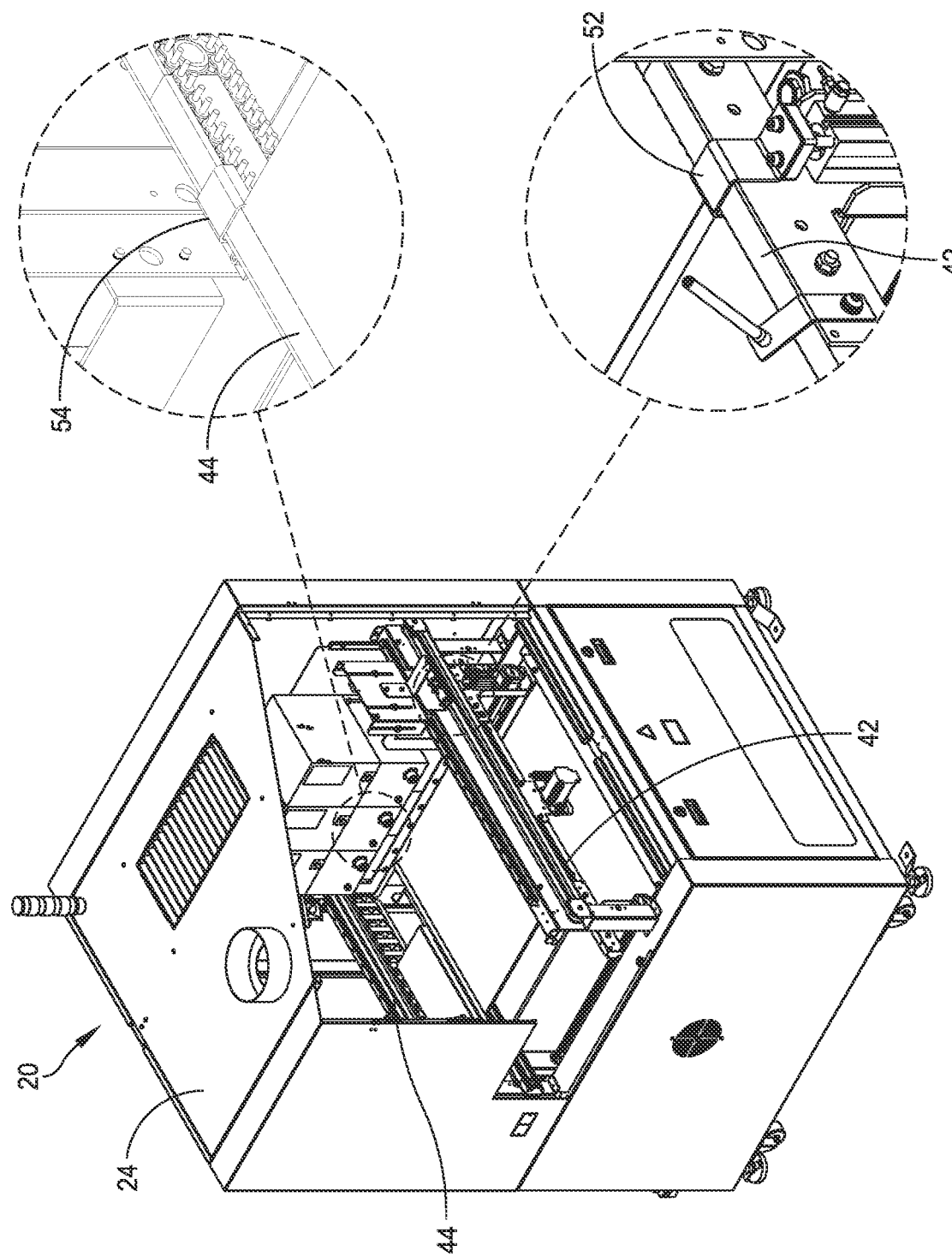
FIG. 8 is a front perspective cutaway view of the UV oven shown in FIG. 2.

Turning to the method depicted in FIGS. 2-6, in FIG. 2 the part 22 is supported on a conveyor, such as an external conveyor belt, which is not shown. The part 22 is positioned adjacent to a first shutter 32 of the housing 24. When the UV oven 20 is ready to cure the UV curable material, the first shutter 32 opens. FIG. 3 shows the first shutter 32 in the open position. In FIG. 3, the part 22 is moved along arrow A into the interior volume of the housing 24. The part 22 moves into the interior volume of the housing 24 until the part 22 abuts at least one board stop 52, 54 (shown in FIG. 8) within the housing 24. The board stop limits movement of the part along arrow A to ensure the part 22 is at an appropriate position within the housing 24. For example, the board stops may limit movement of the part 22 along arrow A so that the part 22 is centered within the housing 24 when the part abuts the board stops.

Once the part 22 is entirely received within the interior volume of the housing 24, the first shutter closes 32. The first shutter 32 is shown in the closed position in FIG. 4. With the first shutter 32 closed, the UV lamps 38 are turned on to cure the applied coating on the part 22, and the carriage 40 moves along arrow B (in FIG. 4) over the part.

Figure 5:
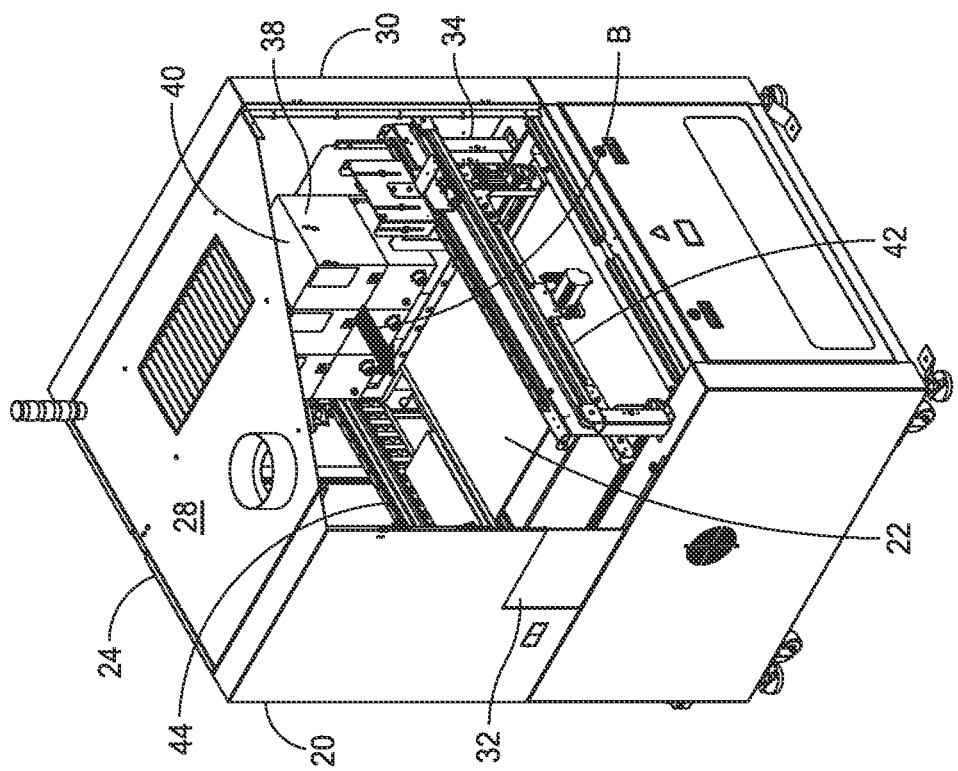
FIG. 5 is another step of operating the UV curing system of FIG. 2.
Figure 6:
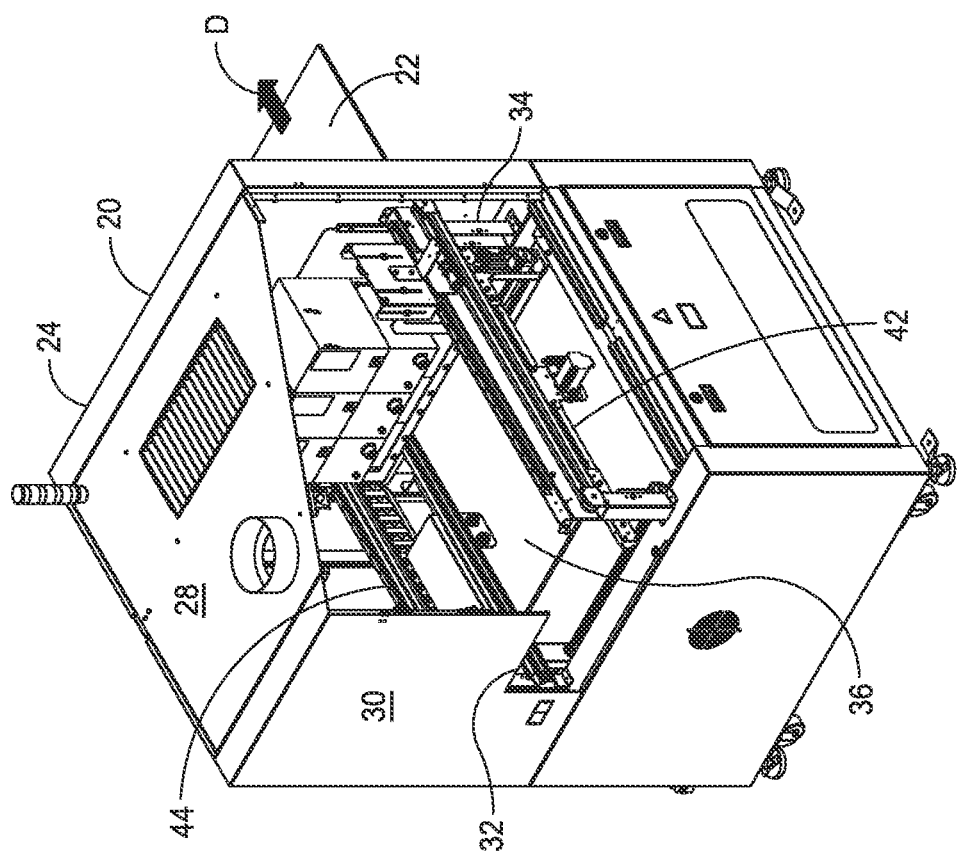
FIG. 6 is another step of operating the UV curing system of FIG. 2.

When the UV lamps 38 are turned off, as shown in FIG. 5, the carriage 40 is moved along arrow C to its start position. In FIG. 6, the second shutter door 34 opens and the part 22 moves long arrow D out of the housing. In some embodiments, the part 22 may be conveyed from the UV oven 20 to other equipment downstream of the UV oven 20 for further processing or manufacturing steps. In some embodiments, the part 22 may be collected and packaged.

Thus, it should be observed that the systems and methods disclosed herein are particularly suited for UV curing of a material using an oven that has a relatively small footprint. For example, the length of the oven of the present disclosure is shorter than lengths of prior art UV curing ovens. Methods and systems of the present disclosure include UV ovens having a smaller footprint than prior art UV ovens that deliver the same UV dose to a substrate. In some embodiments, methods and systems of the present disclosure enable UV curing of materials with microwave technology with the smallest floor space possible. In some embodiments, methods and systems of the present disclosure include a housing having a length of 45 inches instead of a traditional oven having a length of 66 inches. Systems and methods of the present disclosure allow a user to increase or decrease a dosage of UV lamp energy applied to a substrate by a moving lamp. For example, the dosage may be set based on a desired UV exposure time for a substrate. Systems and methods disclosed herein are suited for controlling the UV dosage applied to a part based on variable speed of a lamp relative to a UV oven housing, such as a variable speed of the lamp along at least one guide rail within the housing. Another advantage of systems and methods of the present disclosure is that they consume less energy than prior art systems and methods, as the lamps are only energized when required. Additionally, systems of the present disclosure enjoy longer service life of lamp components due to only being energized when required. Another advantage is that systems and methods of the present disclosure allow for a part to be cured by multiple passes of the UV lamp over the part. Multiple curing pass capability of the part within the oven allows for higher UV dosages without overheating the substrate and a reduction in part production cycle time.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. A UV oven for curing an applied coating on a part, the UV oven comprising:
   a housing including a top wall, a bottom wall, and side walls that enclose an interior volume of the housing;
   a first shutter located on the side walls and configured to be selectively opened to selectively allow the part to enter or exit the interior volume of the housing;
   a conveyor secured to the housing and having a surface on which the part may be supported; and
   at least one UV lamp supported within the housing by a carriage that is movable with respect to the housing.

2. The UV oven of claim 1, wherein the at least one UV lamp is a plurality of UV lamps.

3. The UV oven of claim 1, further comprising a pair of guide rails secured to the housing that support the carriage.

4. The UV oven of claim 3, wherein the carriage is movable from a first location at which the carriage is located towards one of the side walls to one or more other locations along the guide rails.

5. The UV oven of claim 3, further comprising at least one actuator to move the carriage along the guide rails.

6. The UV oven of claim 5, further comprising a controller and at least one sensor for detecting a position of the part or a position of the carriage, the controller being configured to cause the at least one actuator to move the carriage in response to a signal received from the at least one sensor.

7. The UV oven of claim 5, wherein the at least one actuator is configured to move the carriage at a preprogrammed rate.

8. The UV oven of claim 5, wherein the at least one actuator is configured to move the carriage at a variable rate.

9. The UV oven of claim 8, wherein the variable rate is based on a thickness of the part.

10. The UV oven of claim 8, wherein the variable rate includes a first rate when the carriage is moved over a first portion of the part and a second rate when the carriage is moved over a second portion of the part, the first rate being faster than the second rate.

11. The UV oven of claim 1, further comprising a second shutter located on the side walls and configured to be selectively opened to selectively allow the part to enter or exit the interior volume of the housing.

12. The UV oven of claim 1, further comprising a trolley secured to the housing for moving the part through the housing.

13. The UV oven of claim 1, wherein the at least one UV lamp includes one of a microwave activated UV curing lamp, an arc lamp, or an LED lamp.

14. The UV oven of claim 1, further comprising a controller, wherein the at least one UV lamp includes a plurality of UV lamps, and the controller is configured to cause a first set of UV lamps selected from the plurality of UV lamps to illuminate.

15. The UV oven of claim 14, wherein the controller is further configured to turn the first set of UV lamps off and to subsequently cause a second set of UV lamps selected from the plurality of UV lamps to illuminate.

16. A method of UV curing an applied coating on a part, the method comprising:
   conveying a part that has an applied coating thereon into a housing;
   exposing the applied coating to UV light from at least one UV lamp supported within the housing by moving the at least one UV lamp relative to the housing; and
   conveying the part out of the housing.

17. The method of claim 16, further comprising
   closing a first shutter of the housing and closing a second shutter of the housing after conveying the part into the housing.

18. The method of claim 16, wherein moving the at least one UV lamp relative to the housing includes moving the at least one UV lamp at a preprogrammed rate.

19. The method of claim 18, wherein moving the at least one UV lamp at the preprogrammed rate includes moving the at least one UV lamp at a variable rate.

20. The method of claim 19, wherein the variable rate is based on a thickness of the part.

* * * * *